United States Patent
Chiu et al.

(10) Patent No.: US 6,717,432 B2
(45) Date of Patent: Apr. 6, 2004

(54) SINGLE AXIS MANIPULATOR WITH CONTROLLED COMPLIANCE

(75) Inventors: Michael A. Chiu, Somerville, MA (US); Neil R. Bentley, Westborough, MA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 10/173,360

(22) Filed: Jun. 17, 2002

(65) Prior Publication Data

US 2003/0193327 A1 Oct. 16, 2003

Related U.S. Application Data

(60) Provisional application No. 60/373,065, filed on Apr. 16, 2002.

(51) Int. Cl.$^7$ .............................................. G01R 31/02
(52) U.S. Cl. ................................. 324/765; 324/158.1
(58) Field of Search .......................... 324/765, 758, 324/754, 72.5, 761, 755, 158.1; 714/724, 719, 720; 414/225, 226, 416; 73/866.5, 865.8

(56) References Cited

U.S. PATENT DOCUMENTS

| | | | | |
|---|---|---|---|---|
| 5,241,870 A | * | 9/1993 | Holt .......................... 73/866.5 |
| 5,506,512 A | * | 4/1996 | Tozawa et al. ............. 324/754 |
| 5,656,942 A | * | 8/1997 | Watts et al. ................ 324/754 |
| 5,818,219 A | * | 10/1998 | Hama et al. ............. 324/158.1 |
| 5,949,002 A | * | 9/1999 | Alden ....................... 73/866.5 |
| 6,441,607 B1 | * | 8/2002 | Buermann et al. ....... 324/158.1 |

* cited by examiner

*Primary Examiner*—David A. Zarneke
*Assistant Examiner*—Jimmy Nguyen
(74) *Attorney, Agent, or Firm*—Teradyne Legal Department

(57) ABSTRACT

A semiconductor test system that includes a tester, a material handling unit and a manipulator that positions the tester relative to the material handling unit. The manipulator is in the form of a cart that can be wheeled to the material handling unit. The cart is attached to the mateiral handling unit to provide course positioning of the tester relative to the handling unit. Major motion of the test head is constrained to an axis perpendicular to the mating interface of the material handling unit. However, compliant motion, with up to six degrees of freedom, is possible in a complaint zone near the handler. In this way, alignment units on the tester and material handling unit can accurately control the final positioning of the tester relative to the material handling unit.

20 Claims, 5 Drawing Sheets

SINGLE AXIS MANIPULATOR WITH CONTROLLED COMPLIANCE

RELATED APPLICATION INFORMATION

This application claims priority of U.S. provisional application No. 60/373,065 filed Apr. 16, 2002.

FIELD OF INVENTION

This invention relates generally to manufacture of semiconductor devices and more particularly to mechanical systems that position testers relative to a material handling unit in an automatic test system.

BACKGROUND

In the manufacture of semiconductor devices, the semiconductor devices are usually tested at least once during the manufacturing operation. Further processing is done on the devices based on the results of the tests. The testing might be used to separate properly operating devices from devices that fail to operate properly. However, testing can also be used to feed back data to other stages in the manufacturing operation to make adjustments that increase the yield of properly operating devices. In other instances, the test results are used to sort devices into performance categories. For example, a device might operate at data rates of 200 MHz, but not operate at data rates of 400 MHz. Following testing, the device might be classified as a 200 MHz device and sold at a lower price than a 400 MHz device.

A testing stage might also be used to make physical changes to the device under test. Many semiconductor devices with memories contain redundant elements. If defective memory cells are discovered during testing, the semiconductor device might be sent to a repair station, such as a laser repair station, where connections on the device are rearranged to disconnect the faulty cells and connect redundant elements in their places.

Testing is generally performed by Automatic Test Equipment (ATE). A tester contains the circuitry that generates and measures the electrical signals needed to determine if the device is properly functioning. A separate material handling device moves the semiconductor devices to the tester. A material handling device is often called a "handler" when the semiconductor devices are being tested after they have been packaged. A material handling device might alternatively be called a "prober", which is used when the semiconductor devices are tested while still on a wafer. In general, the tester and the material handling device are assembled into a work cell, with the specific characteristics of the tester and material handling device being selected based on the type of devices that are to be tested.

In manufacturing semiconductors, it is desirable that the equipment in the fabrication facility be in service as much as possible. Taking equipment out of service, even to make routine adjustments to the equipment, can reduce the cost effectiveness of the entire manufacturing operation.

For example, most testers are designed to test many different types of semiconductor devices. Because different semiconductor devices have different sizes and numbers of test points, ATE usually includes an interface unit, such as a "device interface unit" (DIB), that is configured for the specific type of device to be tested. To configure the ATE for a specific type of device, a different interface unit is installed in the ATE.

Usually, the interface unit is located between the tester and the material handling unit. To change the interface unit, it is necessary to separate the tester and material handling unit. Therefore, ATE has generally included a "manipulator" or "positioner" for the tester. An example of a manipulator is shown in U.S. Pat. No. 5,931,048 entitled "Manipulator for Automatic Test Equipment Test Head." The manipulator in that patent is described in conjunction with a test system in which the tester has two separate pieces—a body and a test head. Regardless of whether the tester is in two pieces or contained within a single unit, some portion of the tester is generally positioned against the material handling unit so that the devices to be tested can be presented to the tester electronics.

Many different types of material handling devices are known. Different ones present the devices to be tested in different orientations. For example, some present the devices in a vertical plane. Others present them in a horizontal plane. For that reason, manipulators have generally been built to allow the tester to be moved with multiple degrees of freedom. In that way, regardless of the orientation in which the material handling unit presents the devices to be tested, the tester can be positioned adjacent the interface area where the material handler presents the devices. The above mentioned U.S. Pat. No. 5,931,048 is an example of a manipulator with multiple degrees of freedom.

However, providing multiple degrees of freedom makes it difficult to align the tester and the handler for proper engagement of the tester and the material handling unit. The process of attaching the tester to the material handling unit is sometimes called "docking." To aid in the docking, positioning units on the tester and the handling unit have been used. An example of positioning units are shown in U.S. Pat. No. 5,982,182 entitled "Interface Apparatus for Automatic Test Equipment with Positioning Modules," which is hereby incorporated by reference.

The positioning modules of U.S. Pat. No. 5,982,182 are designed to engage when the tester is positioned near the handling device. The engagement provides a course alignment of the tester and the material handling unit. As the tester and material handler are pushed together, the shape of the positioning module accurately positions the components relative to each other. In the preferred embodiments of that patent, the positioning module included a linear actuator that could, once engaged, could draw the tester and material handling unit together.

For the relative position of the tester and the material handling unit to be accurately defined by the shape of the positioning unit, it is necessary that the manipulator not put excessive force on the tester. Therefore, preferred manipulators included a compliant mode that allowed sufficient motion of the test head. However, the motion must not be so great that the tester moves uncontrollably. The manipulator described in the above mentioned U.S. Pat. No. 5,982,182 was designed for such compliance. Another example of a manipulator with compliance is found in U.S. Pat. No. 5,949,002.

SUMMARY OF THE INVENTION

With the foregoing background in mind, it is an object of the invention to provide a manipulator for a tester that can move with limited degrees of freedom to provide course alignment, but can move with more degrees of freedom to provide compliant motion for docking.

Such a tester is provided with a manipulator that has a base member and a stage carrying the tester. The base and stage can move relative to each other, but a guide assembly constrains the degrees of freedom of that motion in areas outside a complaint zone.

BRIEF DESCRIPTION OF THE DRAWINGS

The invention will be better understood by reference to the following more detailed description and accompanying drawings in which.

DESCRIPTION OF THE PREFERRED EMBODIMENT

The present invention is, in its preferred embodiment, used in connection with a material handling unit for packaged parts testing. Therefore, the description of the preferred embodiment that follows uses a packaged part handler as an example.

Figure 1A:
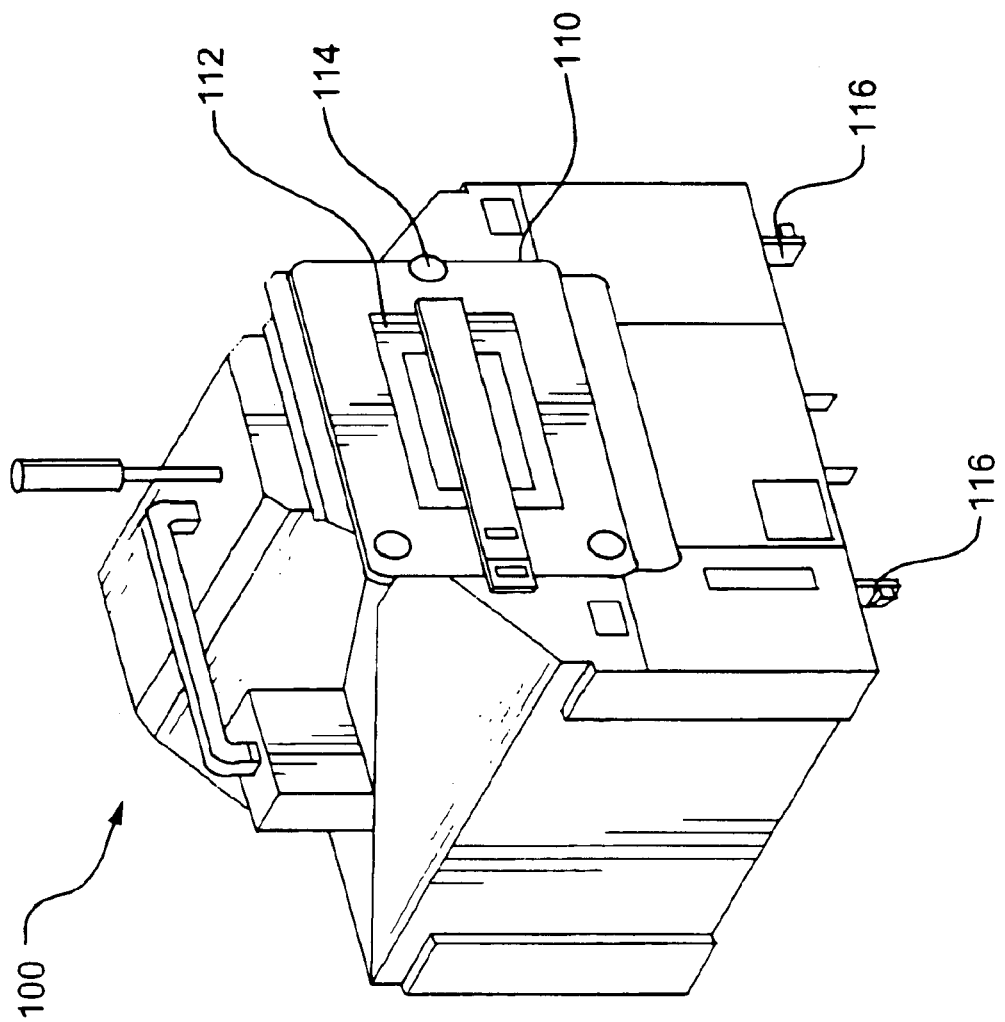
FIG. 1A is a sketch illustrating a material handling unit.
Figure 1B:
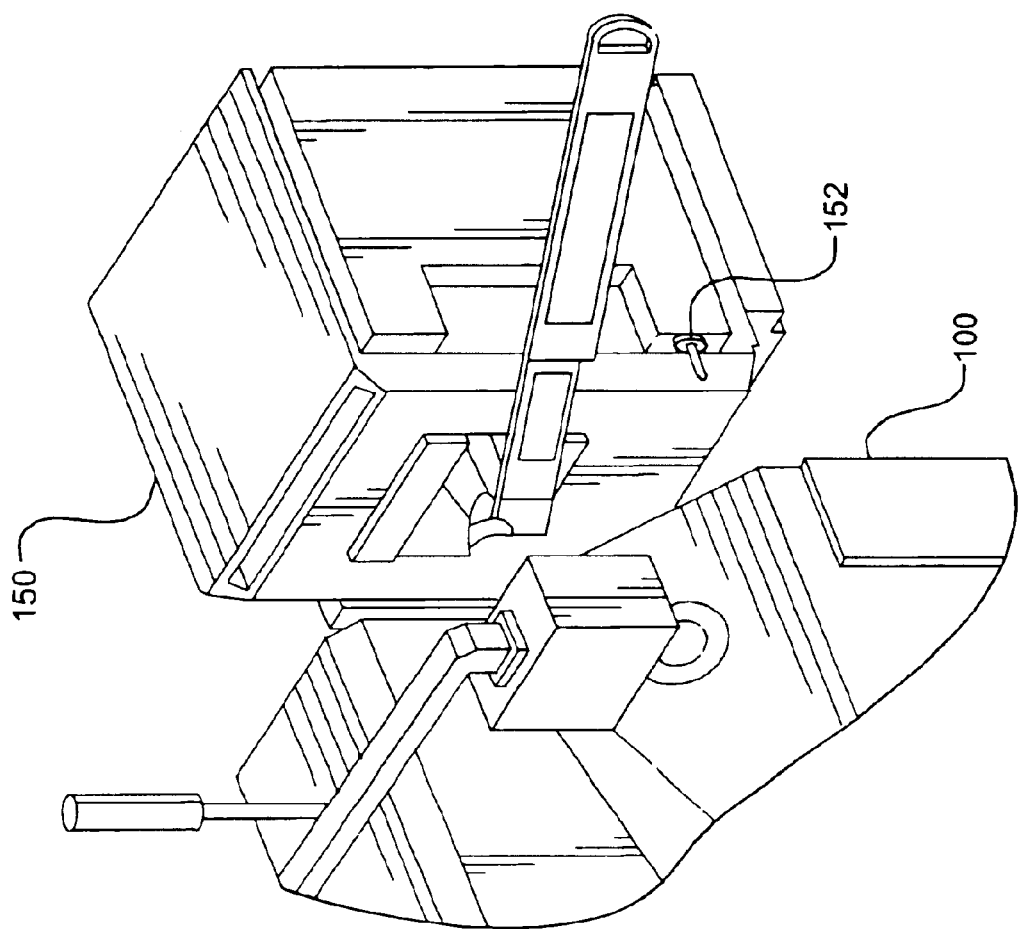
FIG. 1B is a sketch illustrating a work cell with a tester separated from the material handling unit.

FIG. 1A shows such a handler 100. Handler 100 includes an interface area 110 where a complementary interface area on a tester (150. FIG. 1B) will interface to the handler. Generally, the handler includes a device interface board (DIB) 112. On one side. DIB 112 contains numerous contactors which make electrical connection to the devices being tested. The contactors connect to conducting pads on the exposed side of DIB 112. Spring pins (not shown) in the interface area of the tester make contact to these pads, creating signal paths from the tester 150 to the devices being tested. However, for the system to work reliably, the tester and the handler must be aligned.

Interface area 110 includes a plurality of interface modules 114. Three modules are preferred for more accurate alignment. In the preferred embodiment, interface modules 114 are kinematic interface modules as described in the above mentioned U.S. Pat. No. 5,982,182, which is incorporated by reference.

The mating interface modules 152 are mounted on tester 150. These modules include posts that engage holes in modules 114 for course alignment. Latches inside modules 114 engage the posts to latch tester 150 to handler 100. Preferably, the modules 114 also include linear actuators that pull the modules 152 toward modules 114. In this way, the kinematic mating surfaces of the modules 114 and 152 engage to define the final position of the tester relative to the handler.

For the interface modules to reliably dictate the relative position of the tester and the handler, it is necessary that the manipulator for tester 150 provide compliance during the final stages of mating. However, it is preferable that the manipulator be constrained in the number of degrees of freedom when it is not in compliant mode. Reducing the number of degrees of freedom makes the tester easier to manipulate. Easier manipulation allows the tester to be docked or undocked more quickly, thereby increasing the amount of time the work cell is functioning to test semiconductor devices.

Figure 2:
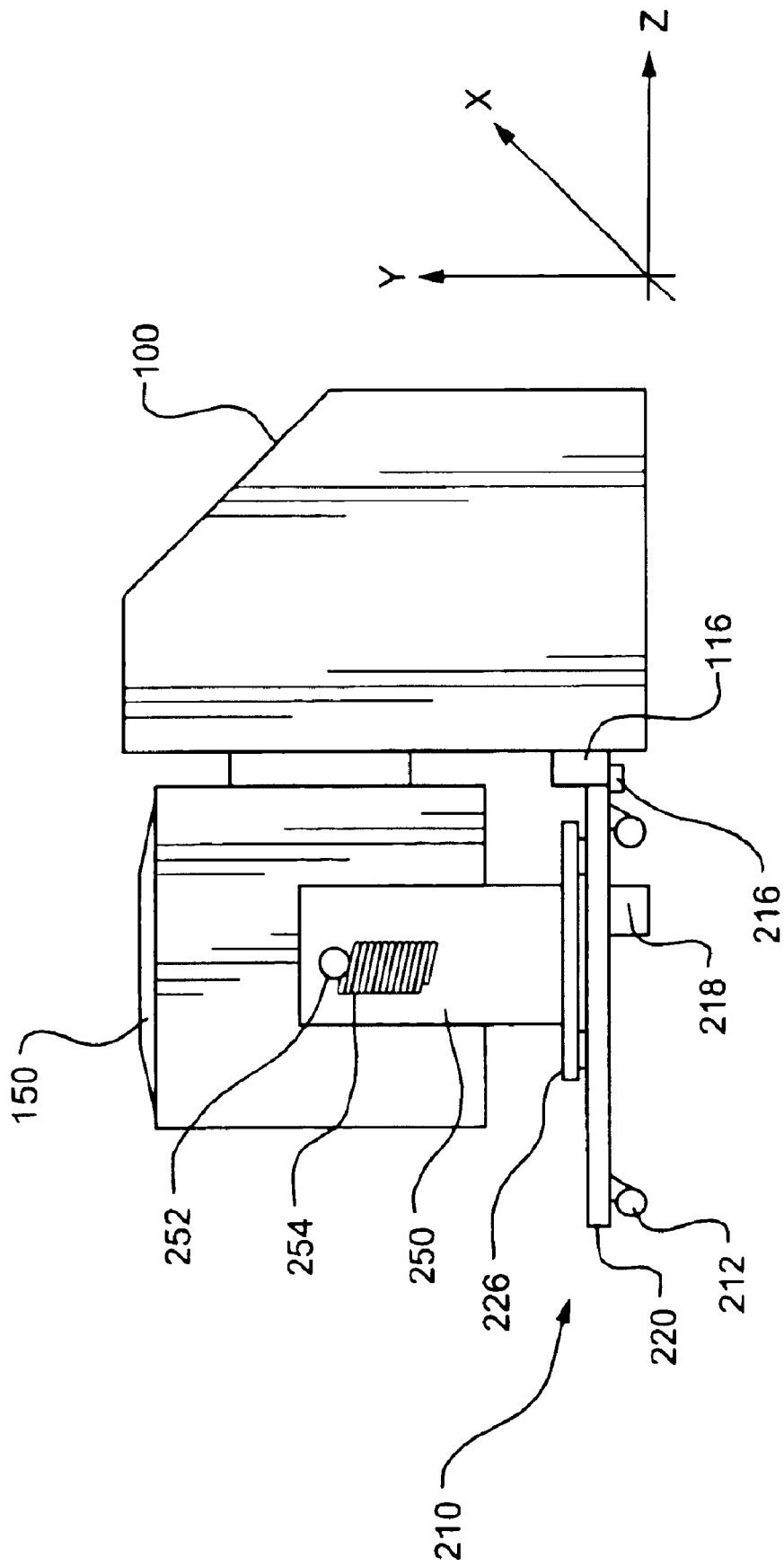
FIG. 2 is a side view of the tester docked to the handler.

FIG. 2 shows a cart style manipulator designed to be quickly engaged to a handler. It is also designed to allow an operator to quickly separate the tester and the handling device, such as when it is necessary to change the DIB. Such a manipulator is well suited for use with a quick-change DIB changer as described in our provisional U.S. patent application No. 60/372,997, entitled "SEMICONDUCTOR TEST SYSTEM WITH EASILY CHANGED INTERFACE UNIT," filed on the same date as the present application and which is hereby incorporated by reference. In that application, there is a significant advantage if the tester and the handler can be quickly separated by a few inches in a direction perpendicular to the mating interface.

FIG. 2 shows a side view of tester 150 docked to handler 100. In the illustrated embodiment, tester 150 rests on cart 210, which plays the role of a manipulator. Cart 210 is designed to allow compliant motion with multiple degrees of freedom as tester 150 gets very close to handler 100. However, it is preferable that this range of compliance is provided only in a compliant zone where interface modules 114 and 152 are positioning the tester relative to the handler. Outside the compliant zone, it is preferable if motion of tester 150 is allowed in only a limited number of directions. In the preferred embodiment, outside the compliant zone, major motion is only allowed perpendicular to the mating interface, which is termed the Z-direction.

Cart 210 includes wheels 212 that allow cart 212 to be wheeled to handler 100. Handler 100 and cart 212 contain features that latch cart 212 to handler 100 and provide course alignment of the tester to the handler in the X, Y and Z directions.

Figure 4:
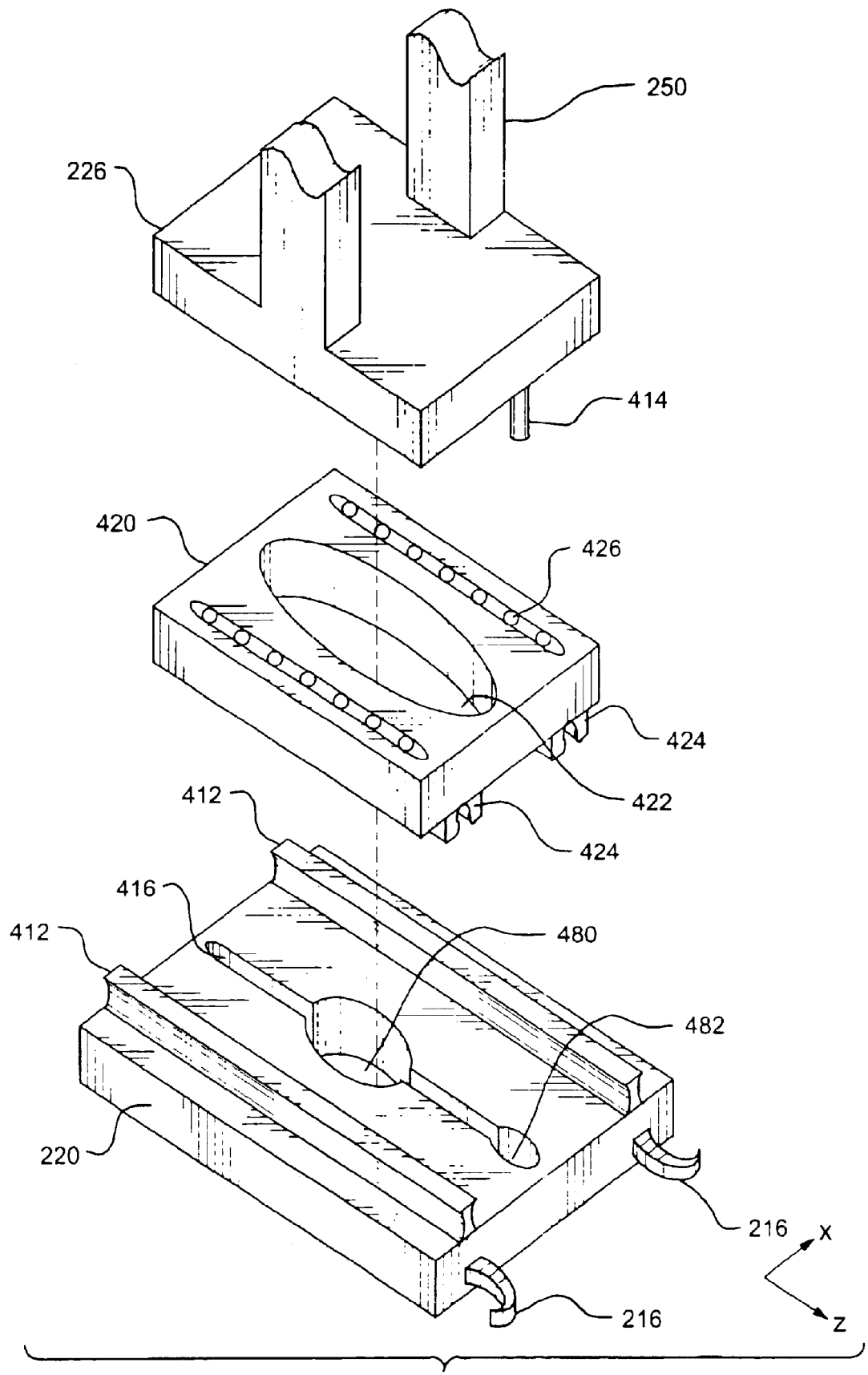
FIG. 4 is an exploded view of the base assembly of the manipulator.

As seen more clearly in FIG. 4, base member 220 has an attachment feature 216 that provides course positioning in the X-direction by engaging with a complementary feature in handler 100. In the illustrated embodiment, attachment feature includes hooks 216 that engage posts (116, FIG. 1). Attachment features that allow a hook to engage a post are known in the art. And, such attachment features are known that engage as two bodies come together. Thus, the hooks 216 could engage attachment feature 116 as cart 210 is pushed toward handler 100.

An advantage of a hook engaging a post is that, while it provides course positioning in the X-direction and the Z-Direction, it allows cart 210 to move in the Y-direction relative to handler 100. Using two hooks at each edge of cart 210 also provides course positioning for rotation about the Y-axis To provide course positioning in the Y-direction, handler 100 includes a jack 218. Jack 218 could be a device known as a "pallet jack" or similar structure. Jack 218 raises the front of cart 210 until hooks 216 reach the tops of the alignment features 116. These course alignment features position the interface portion of tester 150 relative to the interface area of handler 100 in the Y-direction. These features also compensate for any rotation of tester 150 relative the handler 100 about the Z-axis. Compensating fro such rotation would be important, for example, if the test cell sits on an uneven floor.

Once course alignment of tester 150 is obtained in the X-Y plane, tester 150 can be moved in the Z direction to bring it closer to handler 100 or to move it further from the handler, such as might be necessary to change a DIB. In the illustrated embodiment, tester 150 is mounted on an upper stage 226. Upper stage 226 is coupled to linear rails (412, FIG. 4) that allow motion in the Z-direction. In this way, tester 150 can be moved in the Z direction. Thus, even though cart 210 is latched to provide course alignment in the X-Y plane, the tester and handler can be separated in the Z-direction to allow quick and easy access for adjustments, DIB changing or similar maintenance functions.

It is preferable that the degrees of freedom be constrained so that major motion of tester 150 is limited to motion in the Z direction once cart 210 is attached to handler 100.

However, cart 210 is designed to provide "funneled compliance" so that proper alignment during docking can occur. Funneled compliance means that the compliance increases significantly as the tester is near the handler so that compliance is available in the final docking, but there is significantly less compliance when the tester is otherwise being moved.

Figure 3:
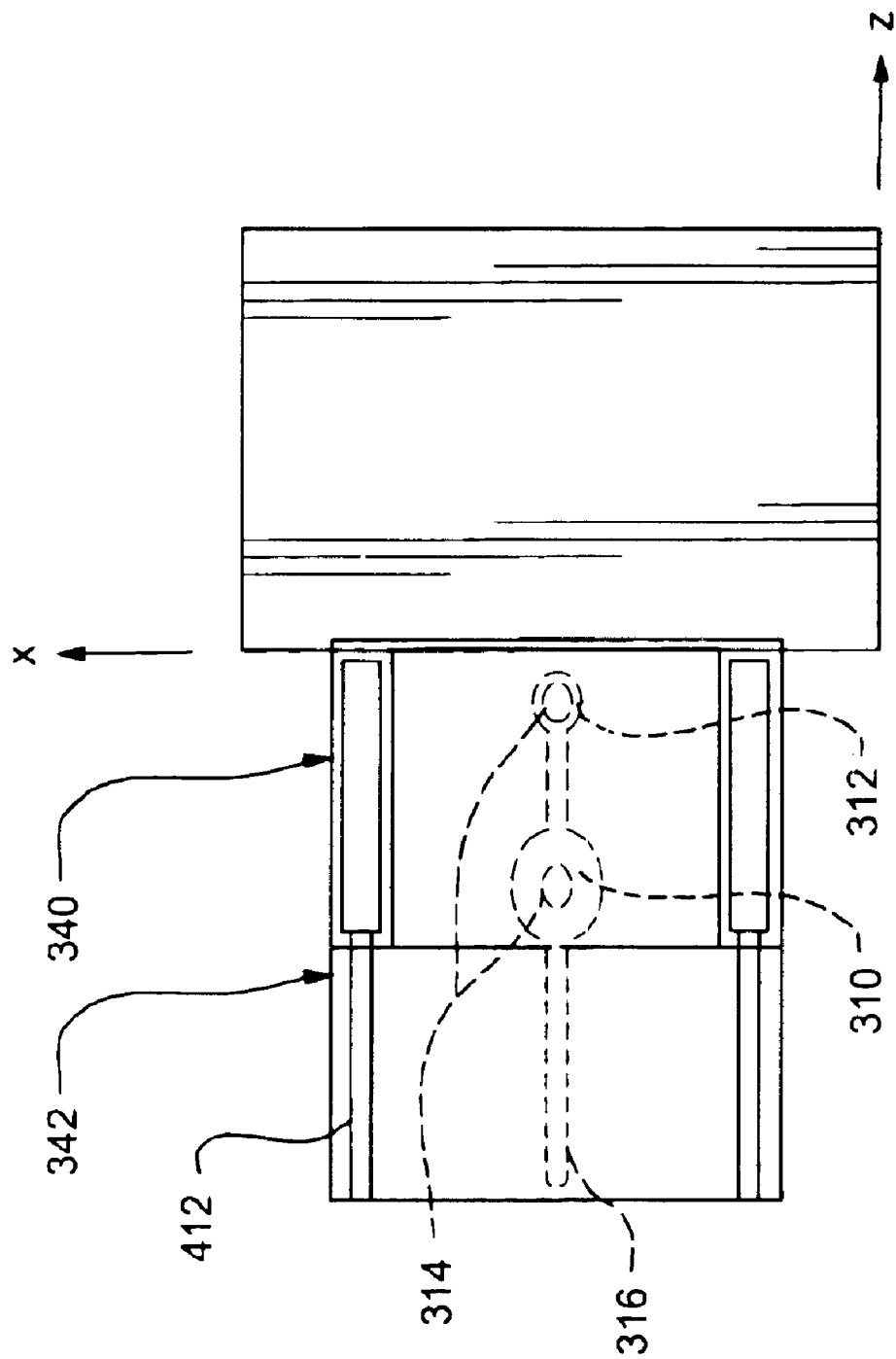
FIG. 3 is sketch illustrating funneled compliance.

FIG. 3 illustrates the principle of how this funneled compliance is achieved. FIG. 3 shows in schematic form a top view of base 220. Linear rails 412 run generally in the Z-direction. A precision guide 316 is formed on the base running in the Z-direction. Engaging features 314 extend from upper stage 226 and guided along guide 316. Guide 316 is shaped to allow motion of engaging features 314 in substantially one direction over much of its length in the constrained zone 342. In the illustrated embodiment, motion is constrained to the Z-direction in the constrained zone 342. Therefore, upper stage 226 (and tester 150 attached thereto) is precluded from moving in the X-direction or rotating in the X-Z plane. In this way, all course motion is limited to the Z-direction while tester 150 is in the constrained region. Limiting course motion to a single direction makes the test system easier to operate.

However, guide 316 has two areas 310 and 312 in which the motion of guided features 314 are not constrained to move in just one direction. When tester 150 gets close to handler 100 and enters the compliant zone 340, guided features 314 will enter the areas 310 and 312. The guided features 314 will no longer be constrained to move only in the Z-direction by guide 316. Once they reach areas 310 and 312, guided features 314 can move, over some range of compliant motion, freely in the X-Z plane. The range of compliant motion is dictated by the size of areas 310 and 312.

In the illustrated embodiment of FIG. 3, area 310 is larger than area 312. This relative sizing provides greater compliance for rotation about the Y-axis without making the range of compliant motion in the X direction unreasonably large.

In the preferred embodiment, the areas 310 and 312 are positioned relative to the front edge of cart 210 so that guided features 314 do not enter the enlarged areas until tester 150 is close enough to handler 100 that alignment features 152 engage alignment features 114. In this way, tester 150 can be latched to handler 100 before the tester enters the compliant zone.

Possibly, linear bearings 412 constrain motion of the tester in any direction except the Z-direction and would possibly not allow sufficient compliance in the X-direction or rotation about the Z-axis, even when the guide 316 is not constraining motion. Therefore, in implementation, the preferred embodiment includes structures that more freely allow compliant motion of upper stage 226 in the compliant zone.

In the embodiment of FIG. 4, an intermediate stage 420 is inserted between upper stage 226 and base 220. Intermediate stage 420 includes features 424 that engage linear rails 412. In this way, intermediate stage 420 is allowed to move in the Z-direction.

Upper stage 226 rests on intermediate stage 420. The interface between intermediate stage 420 and upper stage 226 is low friction to allow stage 226 to slide easily relative to intermediate stage 420. In the preferred embodiment, the low friction interface is provided by a plurality of ball bearings 426 in the upper surface of intermediate stage 420. Ball bearings 426 are constrained in raceways or other conventional mechanisms. In this way, upper stage 226 can move in the X direction or rotate about the Y-axis in the compliant zone.

The guided features are provided by posts 414 that extend from the lower surface of upper stage 226. Intermediate stage 420 includes a hole 422 that allows posts 414 to pass from upper stage 226 to slot 416.

Slot 416 acts as a guide. It is shaped to receive posts 416 and over much of its length is machined to have a width that closely matches the diameter of posts 416. In this way, motion of posts 416 is constrained to translation along the Z-axis over much of the range of motion of upper stage 226. However, slot 416 includes enlarged areas 480 and 482. When posts 416 enter these enlarged areas, they are free to move or rotate freely in the X-Z plane, thereby allowing compliant motion. In this way, upper stage 226 is constrained to move only in the Z-direction, until it reaches the compliant zone and the required "funneled compliance is provided.

Returning to FIG. 2, it can be seen that tester 150 is mounted to arms 250 at pivot points 252. Only one pivot point is shown in FIG. 2, though it will be appreciated that tester 150 is mounted between two arms that each has a pivot point. The amount of rotation about pivot points 252 is constrained. However, the amount of rotation is sufficient to provide compliant rotation in a direction about the X-axis.

Further, pivot points 252 are mounted to arms 250 through springs 254. A spring mounting allows each pivot point 252 to move up or down in the Y-direction, thus providing compliance in the Y-direction. And, because the pivot points are independently mounted, they can move different amounts or in different directions to allow compliant rotation about the Z-axis.

Thus, once cart 210 is latched to handler 100, the major course motion of the tester is along one axis—the Z-direction in the illustrated embodiment. However, the ATE system is equipped with funnel compliance that increases once the tester enters the compliant zone. In the compliant zone, the tester can have up to six degrees of freedom for compliant motion.

Having described one embodiment, numerous alternative embodiments or variations might be made. For example, the various motions were described to have been caused by a human operator pushing the test system. Various motions could be motor driven.

Also, various embellishments might be made to the embodiment shown herein. For example, rails might be included on the handler or on the floor near handler 100 to guide cart 210 into latching position with handler 100.

Further, other adjustable features might also be included on the manipulator. For example, arms 250 might be made extensible to increase the range of motion in the Z-direction.

A handler with an interface area in a vertical plane was illustrated as the preferred embodiment. This is called a DUT vertical handler. However, it should be appreciated that the other mating arrangements might be achieved. For example, if the mating interface of the tester faced up, the funnel compliance might be placed in the arms 250 to allow constrained motion in the Y direction.

Also, it should be appreciated that groove 416 cut into base member 220 is not the only way that the required guide assembly might be constructed. A groove could be constructed by placing a structure on the top surface of base 220 that had walls resembling the walls of groove 416.

Furthermore, a pin in a groove is not the only mechanism for achieving funneled compliance. Posts 414 might have a U-shaped end. The U-shaped ends might engage a rail on the upper surface of base member 220. In this configuration, compliance would be achieved by reducing the thickness of the rail or eliminating the rail entirely.

Funneled compliance could also be achieved by forming posts 414 as calipers that grasp a rail on the upper surface of base 220. To prevent compliance, the calipers would be closed. To increase compliance, the calipers would be opened, creating more space between the calipers and the rail. By opening the calipers in the compliant region, funneled compliance could be achieved. The calipers might be opened with a motor or with a camming device that causes greater spread of the calipers as the tester enters the compliant zone.

Further, it should be appreciated that mating pieces might be switched in orientation. For example, hooks 216 might be on handler 100 with posts 116 on cart 210. Or a groove might be cut in upper stage 226 and posts might extend from base 220.

Further, it will be appreciated that the linear rails of the preferred embodiment provide a simple way to achieve constrained linear motion over a relatively large distance. In some applications, it will not be necessary to use the linear rails. Where linear rails are not desired, intermediate stage 420 would not be necessary either, and the slidable interface between upper stage 226 and base 220 could be achieved by a low friction interface directly between upper stage 226 and base 220.

Therefore, the invention should be limited only by the spirit and scope of the appended claims.

What is claimed is:

1. A method of operating an automatic test system of the type having a tester and a material handling unit that engage at a mating interface, the method comprising;
    a) placing the tester on a wheeled cart;
    b) wheeling the cart to the material handling unit;
    c) attaching the cart to the material handling unit;
    d) constraining major motion of the tester to a direction perpendicular to the mating interface while moving the tester toward the material handling unit;
    e) attaching the tester to the material handling unit;
    f) allowing compliant motion of the tester while moving the tester toward the material handling unit to a position dictated by alignment features on the tester and material handling unit.

2. The method of claim 1 wherein the allowing complaint motion includes allowing compliant motion in a plane perpendicular to the mating interface.

3. The method of claim 1 wherein attaching the cart to the material handling unit comprises elevating a portion of the cart to bring it into alignment with a reference point on the material handling unit.

4. The method of claim 1 further comprising:
    a) testing semiconductor devices with the tester;
    b) further processing the semiconductor devices based on the results of the tests.

5. An automatic test system of the type having a material handling unit and a tester, the automatic test system including a tester positioner, comprising:
    a) a base member;
    b) a stage carrying the tester;
    c) a means, coupled to the base and the stage, for constraining motion of the stage to one degree of freedom in a constrained zone and for allowing motion in a plane in a compliant zone.

6. The automatic test system of claim 5 wherein the means allows compliant translation and rotation in the compliant zone.

7. The automatic test system of claim 5 additionally comprising a latch removably securing the base member to the material handling unit.

8. The automatic test system of claim 5 additionally comprising a plurality of wheels attached to the base member.

9. An automatic test system of the type having a material handling unit and a tester, the automatic test system including a tester positioner, comprising:
    a) a base member;
    b) a stage slidably connected to the base member;
    c) a guide assembly coupled between the base member and the stage, the guide member having a constrained zone and a compliant zone, whereby the guide provides constraints on more degrees of freedom in the constrained zone than in the compliant zone.

10. The automatic test system of claim 9 wherein the guide assembly comprises:
    a) a slot having a major axis and a width perpendicular to the major axis; and
    b) at least one post extending into the slot;
    c) wherein the slot has a constrained zone and a complaint zone wherein the width of the slot is greater in the compliant zone.

11. The automatic test system of claim 10 wherein the width of slot is substantially equal to the diameter of the post in the constrained zone.

12. The automatic test system of claim 9 wherein the base member contains a latching mechanism adapted for latching the base member to the handler.

13. The automatic test system of claim 12 wherein the base member has a forward portion facing the material handling unit and additionally comprises a jack positioned under the base member to elevate the forward portion into alignment with a reference point on the handler.

14. The automatic test system of claim 13 wherein the handler contains at least one post and the latching mechanism includes a hook that encircles the post with sufficient clearance to allow the hook to slide until the forward portion of the base is aligned with the reference point.

15. The automatic test system of claim 9 further comprising:
    a) a set of linear rails disposed on the base member;
    b) an intermediate stage having a first surface and a second surface, the intermediate stage have features slidably engaging the linear rails on the first surface and the second surface being a low friction surface; and
    c) wherein said stage mates with the low friction surface of the intermediate stage.

16. The automatic test system of claim 15 wherein the intermediate stage has an opening therethrough and a portion of the guide assembly projects through the opening.

17. The automatic test system of claim 9 additionally comprising:
    a) a pair of arms extending from the base member in a direction opposite the base member;
    b) pivoting mountings attached to the arms, wherein the tester is attached to the pivoting mountings on each arm.

18. The automatic test system of claim 17 wherein the pivoting mountings are spring mounted to provide compliant motion.

19. The automatic test system of claim 9 used in a method of manufacturing semiconductor devices, comprising:
  a) sliding the tester towards the material handling unit;
  b) latching the tester to the material handling unit;
  c) moving the tester closer to the material handling unit and docking the tester to the material handling unit while the guide assembly is in the compliant zone;
  d) presenting semiconductor devices to the tester with the material handling unit;
  e) testing the semiconductor devices with the tester; and
  f) further processing semiconductor devices based on the results of the test.

20. The automatic test system of claim 9 additionally comprising alignment features on the tester and the material handling unit, the alignment features including latching structures that engage to hold the tester to the material handling unit and surfaces that position the tester relative to the material handling unit.

* * * * *